United States Patent [19]

Cline et al.

[11] Patent Number: 4,849,697
[45] Date of Patent: Jul. 18, 1989

[54] THREE-DIMENSIONAL MAGNETIC RESONANCE FLOW-CONTRAST ANGIOGRAPHY WITH SUPPRESSION OF STATIONARY MATERIAL

[75] Inventors: Harvey E. Cline, Schenectady; Charles L. Dumoulin, Ballston Lake, both of N.Y.

[73] Assignee: General Electric Company, Schenectady, N.Y.

[21] Appl. No.: 211,612

[22] Filed: Jun. 27, 1988

[51] Int. Cl.[4] .......................................... G01R 33/20
[52] U.S. Cl. ................................. 324/306; 324/300; 128/653
[58] Field of Search ............... 128/653; 324/300, 306, 324/307, 309, 318, 322

[56] References Cited

U.S. PATENT DOCUMENTS

| 4,565,968 | 1/1986 | Macovski | 324/306 |
|---|---|---|---|
| 4,609,872 | 9/1986 | O'Donnell | 324/306 |
| 4,714,081 | 12/1987 | Dumoulin | 324/306 |
| 4,716,367 | 12/1987 | Patz | 324/306 |
| 4,718,424 | 1/1988 | Nishimura | 324/306 |
| 4,752,734 | 6/1988 | Wedeen | 324/306 |
| 4,777,957 | 10/1988 | Wenrli | 324/306 |

Primary Examiner—Michael J. Tokar
Attorney, Agent, or Firm—Geoffrey H. Krauss; James C. Davis, Jr.; Marvin Snyder

[57] ABSTRACT

A method for providing a three-dimensional nuclear magnetic resonance (NMR) flow-contrast angiograph of fluid flowing substantially only in a predetermined direction, with suppression of stationary material surrounding the fluid, uses the steps of: acquiring a first set of image data from NMR responses generated from a volume-to-be-imaged by a three-dimensional volume imaging sequence preceded by a saturation portion saturating nuclear spins in a volume adjacent to, and in the direction from which the desired flow will enter, the volume-to-be-imaged; acquiring a second set of image data from other NMR responses generated by the same volume imaging sequence, but devoid of any preceding saturating portion; and subtracting one of the first and second data sets from the other to generate a difference data set from which a final image is displayed. Advantageously, a 3DET volume imaging sequence is used, with bipolar flow-compensation used along both axes of flow encodation. The total first moment of all magnetic field gradient pulses, from volume selection tie to echo time, on each of the separate three Cartesian gradient axes, is nulled, with the total area (the amplitude-time integrated product) of the pulses being set substantially equal to zero alaong two of the three axes. The non-zero pulse area difference along the one selected non-readout axis is balanced by a rewind gardient pulse after completion of the response signal readout.

27 Claims, 3 Drawing Sheets

THREE-DIMENSIONAL MAGNETIC RESONANCE FLOW-CONTRAST ANGIOGRAPHY WITH SUPPRESSION OF STATIONARY MATERIAL

BACKGROUND OF THE INVENTION

The present invention relates to nuclear magnetic resonance (NMR) imaging and, more particularly, to a novel method of three-dimensional NMR flow-contrast angiographic imaging having a high degree of suppression of stationary material.

Non-invasive NMR imaging techniques can be utilized to detect flowing fluids, such as blood, in a sample, such as the human body, being analyzed. Techniques such as NMR angiography provide a selective means of fluid flow detection in blood vessels and the like, although the results do not always correlate well with other techniques, such as X-ray angiography, in measuring projected vessel anatomy, such as might be clinical useful in detecting atherosclerotic plaque. This lack of correlation appears to be due to the limited NMR image resolution caused by an inherently low signal-to-noise ratio, and flow effects which frequently cause artifactual loss of signal intensity. Thus, present NMR flow imaging techniques, and particularly those techniques based upon phase effects, can provide important flow information, but only limited morphological information. Typical of the morphological information desired is the angiographic projection imaging of the bifurcations of the carotid arteries, which bifurcations are a frequent site of atheromatous plaque formation, which is itself a precursor of transient ischemic attack and stroke. It is therefore highly desirable to be able to image atherosclerotic plaque (especially prior to the ulcerization thereof, which may result in subintimal hemorrhage or brain emboli therefrom). The presence of smooth atherosclerotic plaque, causing hemodynamically significant stenosis, is presently clinically evaluated with a standard X-ray dye angiographic procedure, in which clinical evaluation of carotid artery disease requires injection of a contrast dye, via a catheter, in an invasive test which is not totally benign. It is therefore highly desirable to use a non-invasive magnetic resonance technique which provides a display in which only the arterial blood flow appears, with the stationary surrounding tissue and the blood flow in the adjacent veins being effectively suppressed.

BRIEF SUMMARY OF THE INVENTION

In accordance with the invention, a method for providing a three-dimensional nuclear magnetic resonance (NMR) flow-contrast angiograph of fluid flowing substantially only in a predetermined direction, with suppression of stationary material surrounding the fluid, uses the steps of: acquiring a first set of image data from NMR responses generated from a volume-to-be-imaged by a three-dimensional volume imaging sequence preceded by a saturation portion saturing nuclear spins in a volume adjacent to, and in the direction from which the desired flow will enter, the volume-to-be-imaged; acquiring a second set of image data from other NMR responses generated by the same volume imaging sequence, but devoid of any preceding saturating portion; and subtracting one of the first and second data sets from the other to generate a difference data set from which a final image is displayed. Advantageously, a 3DFT volume imaging sequence is used, with flow-compensation used along both axes of phase encodation and along the axis used for frequency encodation.

In a presently preferred pulse sequence for three-dimensional NMR flow-contrast angiography, the first moment of all magnetic field gradient pulses, from volume selection time to echo time, on each of the separate three gradient axes, is nulled (i.e. set substantially equal to zero), with the total area (the amplitude-time integrated product) of the pulses being set substantially equal to zero along two of the three axes, and with the non-zero pulse area difference along one selected non-readout axis being balanced by a rewind gradient pulse after completion of the response signal readout. Nulling of higher order moments to compensate for higher order motion (acceleration, jerk, etc.) can be used, if needed.

Accordingly, it is an object of the present invention to provide a novel method for three-dimensional NMR flow-contrast angiographic imaging with suppression of stationary material.

This and other objects of the present invention will become apparent upon reading of the following detailed description, when considered in conjunction with the drawings.

DETAILED DESCRIPTION OF THE INVENTION

Figure 1A:
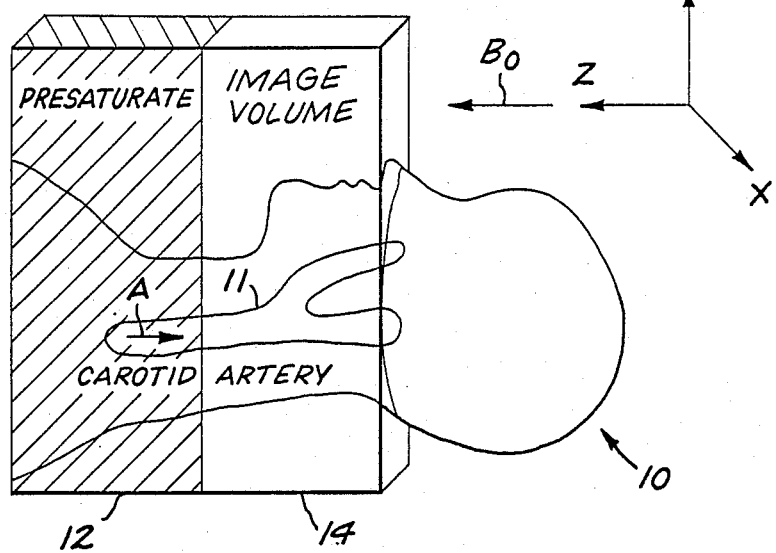
FIG. 1A is a side view of a portion of a human subject, and of the region thereof to be imaged, and useful in appreciating several features of the present invention.

Referring initially to FIG. 1A, a sample 10, such as a living person and the like, to be imaged is situated in a substantially homogeneous static magnetic field $B_0$ directed in along the Z-axis of a Cartesian coordinate system, which, for convenience, is also the primary direction of flow, as shown by arrow A, of a liquid within a vessel 11, such as blood within the carotid artery and the like, in the sample. As a first step in our novel method, nuclear spins are saturated in a first volume 12, displaced to one side of the volume 14 in which fluid flow is to be imaged; the direction of offset is that direction from which the fluid must flow to enter the image volume. The saturation is brought about, illustratively, by perturbation of the nuclei with a selective RF pulse (typically having the effect of rotating, or flipping, the nuclear spin axes by 60°–120°, and preferably by about 90°, and hence will be shown as a selective pulse having a "flip" angle $\alpha'$) which is provided cotemporally with a magnetic field gradient to localize the magnetization M perturbation to volume 12. Thereafter, transverse magnetization spin phase coherence is destroyed, by a "spoiler" pulse and the like. Thus, the preferably 90° RF pulse and associated magnetic field gradient signal pulses serve to saturate the nuclear spins contained in volume 12 by destroying all longitudinal magnetization and transverse spin coherence. The bounds of volume 12 are effectively set by the amplitude and direction of the field gradient pulse used, and by the amplitude, shape and duration of the RF pulse. The saturated nuclei of the stationary material in volume 12 remain within volume 12, but the saturated nuclei of the flowing fluid move into image volume 14 and, when NMR response data is acquired from volume 14 responsive to a three-dimensional volume imaging technique, causes the signal from the flowing fluid (blood) in the vessel (carotid artery) 11 to be selectively decreased. After a time sufficient to allow the nuclei in the fluid to recover from saturation, the same volume 14 is again imaged with the same three-dimensional volume imaging technique, now devoid of the presaturation of nuclei in adjacent volume 12, and the new volume imaging data, in which arterial intensity has not been decreased, is subtracted from the image data obtained with presaturation, so that all responses from material in volume 14 into which the saturated spins have not been carried, from adjacent volume 12, are effectively cancelled; stationary tissues, vessels (veins) in which fluid flow occurs in a direction other than that of arrow A, and the like are effectively suppressed, while vessels (arteries) with flow in direction A show up in high contrast.

Figure 1B:
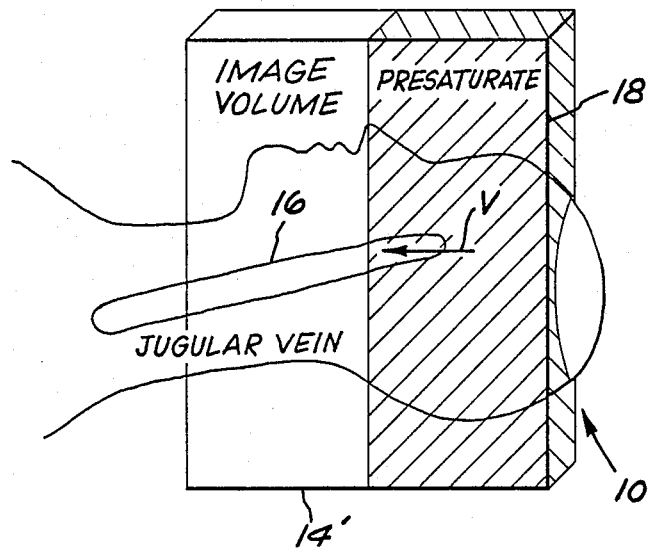
FIG. 1B is another side view of a human subject, illustrating the manner in which emphasis of venous blood flow, with rejection of arterial flow, is achieved, and also useful in understanding several features of the present invention.

Referring now to FIG. 1B, the suppression mode can be exchanged, so that fluid (venous blood) flow in another vessel 16 and in the opposite direction, as shown by arrow V, such as in the jugular vein, is contrasted, while stationary tissue and arterial flow (even in the carotid arteries) in the same imaged volume 14', are effectively suppressed; the presaturated adjacent volume 18 is here offset from the imaged volume 14' in the direction from which the flowing fluid will arrive into the volume 14' to be imaged. The exchange of the lower adjacent volume 12, below the neck region 14 in which arterial flow is to be imaged, for upper adjacent volume 18, above the neck region in which venous flow is to be imaged, can be accomplished by altering the shape of an associated RF pulse and/or the amplitude of the magnetic field gradient in the axial Z direction during presaturation, without movement of the NMR imaging equipment (not shown) or the patient therein. It will be seen that the flow in any direction can be imaged by the presaturation of a volume in the proper offset relationship to the volume to be imaged. It will also be seen that simultaneous saturation of both volumes 12 and 18 can be used, prior to acquisition of image data, to provide simultanous detection of both arterial and venous structures. Further, saturation of the two volumes 12 and 18 can be alternated so that a first data set, acquired with suppression in one direction, e.g. arterial suppression, is subtracted from a second data set acquired with suppression in the opposite direction, e.g. venous suppression, to yield a resulting response data set in which stationary material is not only suppressed, but also with fluid flow in opposite directions having opposite polarity, e.g. arterial and venous blood flows having equal intensity but being of opposite polarity, such that they can be color-coded by such polarity difference. Whether one or both adjacent volumes are presaturated, there can also be a temporal interleaving of the acquisitions of response data from each portion of the total sample to be imaged; thus, a part of the total data set can be acquired, first with preceding saturation and then devoid of saturation, before another part of the data set is acquired.

Figure 2:
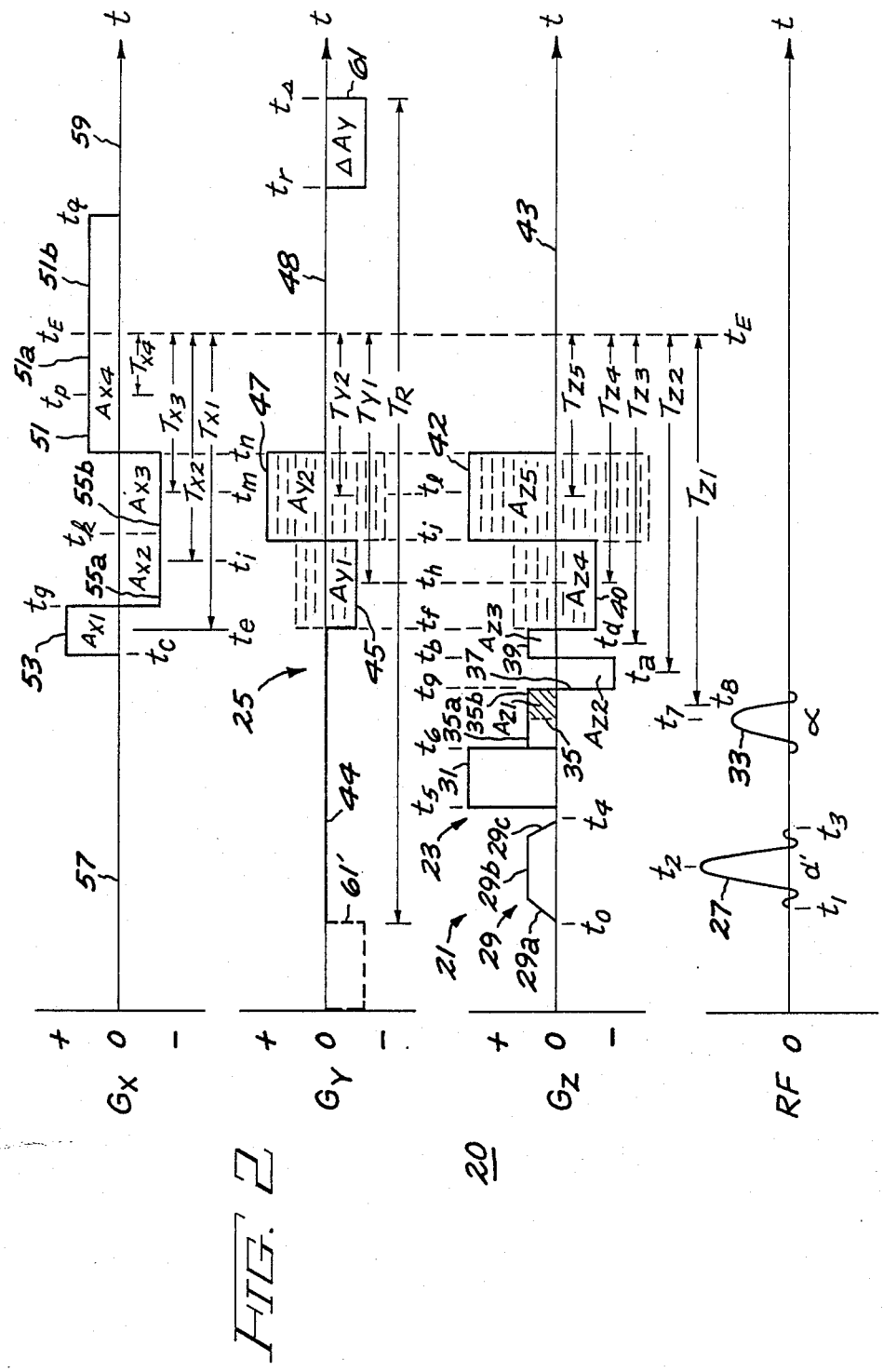
FIG. 2 is a set of time-coordinated gradient and radio-frequency (RF) signal waveforms used in one presently preferred embodiment of the imaging procedure of the present invention.

FIG. 2 illustrates the time-coordinated gradient magnetic fields along the three Cartesian axis, i.e. the X-axis gradient magnetic field $G_X$, the Y-axis gradient magnetic field $G_Y$ and the Z-axis gradient magnetic field $G_Z$, along with the radio-frequency (RF) magnetic field, all applied to the sample to be investigated, in one presently preferred embodiment of the novel NMR imaging method of the present invention. Data for each three-dimensional volume image is obtained from the difference of first and second data sets; the first data set is obtained using a plurality N of repetitions of a first type of the sequence of FIG. 2, each of which first-type sequence contains an initial presaturation portion 21 and a transverse magnetization dephasing portion 23 prior to an imaging portion 25, and the second data set is obtained with an equal number N of repetitions of a second-type of sequence which is similar to the first type sequence in all respects but one, each second data set sequence is devoid of presaturation portion 21 and has only the dephasing and latter imaging portion 25.

Each presaturation portion 21 serves to selectively saturate a volume 12 or 18 of material, prior to flow of some of that material into the image volume 14 of interest. A radio-frequency (RF) pulse signal 27 is applied in the presence of a gradient magnetic field pulse 29, to rotate the transverse magnetization spins of the sample through a flip angle $\alpha'$ of between about 60° and about 120°, with an excitation angle of 90° being preferable. This transverse magnetization rotation reduces the longitudinal magnetization of the fluid in that portion of the fluid vessel upstream of the image volume of interest. Presaturation portion 21 occupies the time interval from time $t_0$ to time $t_4$; a gradient magnetic field in the direction defining the limits of the presaturated volume (here the Z-axis direction) commences with an initial portion 29a, beginning at time $t_0$, when the gradient magnetic field $G_Z$ changes from a substantially zero amplitude towards the final amplitude. Once the substantially constant portion 29b commences, at time $t_1$, the RF pulse commences, reaching a peak at a later time $t_2$ (which time can be considered to be the time at which the RF pulse acts substantially in its entirety), and terminates at a slightly later time $t_3$; the RF pulse can be of any desirable shape, such as a truncated sinc(x) form, limiting the presaturation-excited region to predetermine limits in the Z direction. Here, the RF pulse 27 is complexly modulated by a further cosine factor, serving to determine the degree of offset of the center region 12 from the center of region 14. The presaturation portion ends, in portion 29c, with the return to a substantially zero amplitude of the gradient $G_Z$ at time $t_4$.

In the transverse magnetization dephasing, or "spoiler", portion 23, a pulse 31 of the same or different gradient magnetic field (here, the Z-direction field $G_Z$) occurs between time $t_5$ and time $t_6$, with amplitude-time energy sufficient to dephase any transverse magnetization created by the presaturation operation in portion 21.

Now, data is acquired from the volume 14 containing the vessels of interest, by use of any desired 3D imaging sequence with a low-flip-angle $\alpha$ RF pulse 33. We illustratively use a gradient-refocussed 3D Fourier transform (3DFT) portion 25. The 3DFT portion is repeated the plurality N of times, where N is the product of M stripes in each of L planes making up the total volume. Each portion 25 starts with the RF pulse 33, having the relatively low flip angle α typically in the range from about 20° to about 40°, with a preferred flip angle α of about 30°; the rotation of spins is established in the desired volume responsive to the amplitude of the $G_Z$ gradient magnetic field in pulse 35. Thus, from time $t_6$ (when the imaging portion commences), through a time $t_7$ at the peak of RF pulse 33, until a termination time $t_9$, the Z gradient pulse 35 is present; the pulse is broken into a first portion 35a, from commencement time $t_6$ to midpulse time $t_7$, and a later second portion 35b, from time $t_7$ to termination time $t_9$. The latter pulse portion 35b has an "area" $A_{Z1}$, which is the amplitude-time integration product thereof. This area is approximately equal to the area in first pulse portion 35a. Of particular importance is the occurrence of the center of later portion 35b at a time $t_8$ which defines the effective start of a first-moment time interval $T_{Z1}$, with respect to echo time $t_E$, to be hereinbelow discussed. After imaging volume selection with RF pulse 33 and corresponding gradient $G_Z$ selection pulse 35, the resulting transverse magnetization is rephased by a refocussing pulse 37, which commences at time $t_9$, has a midpoint at a time $t_a$ and terminates at a time $t_b$; pulse 37 has an amplitude and duration selected to provide an "area" $A_{Z2}$, which is substantially equal to twice the area $A_{Z1}$ of later pulse portion 35b. Pulse 37 is followed by a gradient signal pulse 39, with an amplitude and duration selected to provide an "areas" a $A_{Z3}$ substantially equal to the area $A_{Z1}$. Pulses 35, 37 and 39 have a total area and first moment each substantially equal to zero. The sum of all the Z-axis areas $A_{Zi}$, where $1 \leq i \leq 3$, which occur between the temporal center of flip pulse 33 and the echo time $t_E$, is substantially zero. As illustrated, the Z gradient magnetic field $G_Z$ is used to limit the excitation volume, when the volume orientation is axial; the Z axis is also utilized as one of the phase-encoding axes. A second phase-encoding gradient is provided in a selected orthogonal direction; here, this is the Y axis $G_Y$. The remaining orthogonal gradient, i.e. gradient $G_X$ in the X direction in this example, is utilized as the readout gradient. Thus, the gradient magnetic fields in the Y and Z directions are varied through the N combinations of M values of one gradient, say $G_Y$, and L values of the other gradient, say $G_Z$, in manner well-known to the art.

Flow compensation is applied to the two phase-encoding axes (Y and Z) to reduce flow artifacts in the phase-encoding directions. In the illustrated example, the bipolar phase-encoding lobes 45 and 47 in the Y-axis magnetic field gradient $G_Y$ occur for each pair of amplitudes selected to phase-encode one Y-direction "stripe", with all of a plurality of Y-stripes being encoded in one of a larger plurality of sequence repetitions for each of the first and second data sets. The $G_Y$ gradient, which was at a substantially zero amplitude in initial portion 44, is thus set to be at a first polarity (e.g. a positive polarity) and a first amplitude (e.g. here, the maximum phase-encoding Y-direction amplitude) in the Y phase-encoding portion 47, from time $t_j$ to time $t_n$. The Y-axis phase-encoding thus consists of lobe 45 and lobe 47, with opposite polarity; a corresponding velocity-compensation is determined by the first moment of the gradient lobes, with respect to the data acquisition interval center time $t_E$. Y-axis flow compensated lobe 45 commences at time $t_f$ and ends at time $t_j$, when lobe 47 commences. The amplitude-time integration product $A_{Y1}$ of flow-compensated lobe 45 is somewhat less than the amplitude-time area $A_{y2}$ of lobe 47 (which appears to act at a time $t_e$ which is at a time interval $T_{Y2}$ from echo time $t_l$). A first desirable condition is that the first moments in the Y direction be nulled, i.e. add substantially to zero, so that $$M_{Y2} + M_{Y1} = 0 \tag{1a}$$

or $$A_{Y2} \cdot T_{Y2} A_{Y1} \cdot T_{Y1} = 0. \tag{1b}$$

This condition reduces, and (if equality is reached) can remove, the velocity-induced phase shifts caused by phase-encoding gradient pulses 45 and 47. Higher orders of motion are readily compensated for by use of more complex waveforms with higher order moments summed to zero (i.e. acceleration-induced shifts compensated for by nulling of second moment, etc.)

During the same time interval, from time $t_f$ to time $t_n$, the Z-axis phase-encoding lobes 40 and 42 occur. The amplitude-time area $A_{Z4}$ of lobe 40 and the area $A_{Z5}$ of lobe 42 are selected such that the sum of the areas is equivalent to the area of a hypothetical phase-encoding pulse which is not flow-compensated. The Z gradient falls to a substantially zero level in portion 43, after time $t_n$. Another desired condition on the Z-axis gradient lobes is that the sum of the slice select areas is nulled:

$$A_{Z1} + A_{Z2} + A_{Z3} = 0 \tag{2}$$

the other desired condition is the nulling of the total first-moments, with:

$$M_{Z1} + M_{Z2} + M_{Z3} + M_{Z4} + M_{Z5} = 0 \tag{3a}$$

or $$M_{Z1} + M_{Z2} + M_{Z3} + M_{Z4} + M_{Z5} = 0 \tag{3a}$$

or, $$A_{Z1} \cdot T_{Z1} + A_{Z2} \cdot T_{Z2} + A_{Z3} T_{Z3} + A_{Z4} \cdot T_{Z4} + A_{Z5} \cdot T_{Z2} = 0 \tag{3b}$$

where $T_{Z1}$ is the time interval from $t_8$ to $t_E$, $T_{Z2}$ is the time interval from $t_a$ to $t_E$, $T_{Z3}$ is the time interval from $t_d$ to $t_E$, $T_{Z4}$ is the time interval from $t_h$ to $t_E$, and $T_{Z5}$ is the time interval from $t_l$ to $T_E$. As with the Y-axis phase-encoding pulses, Z-axis phase encodation can be made insensitive to higher orders of motion (i.e. acceleration, jerk, etc.) by extending the number of pulses and selecting amplitudes and durations to null the corresponding higher order (i.e. second, third, etc.) moment.

The readout direction X magnetic field gradient $G_X$ is a pulse 51 having a desired value during the readout time interval, from time $t_n$ to time $t_q$ (substantially symmetrical about the echo time $t_E$). Only the first portion of the readout X-gradient pulse 51, from time $t_n$ to time $t_E$ is considered for balancing of $G_X$ areas and moments. We have found that such balancing is best facilitated by use of a pulse lobe 53 having the same polarity (e.g. positive) as the readout gradient pulse 51, and counterbalanced by a pulse 55 of opposite polarity. Thus, the X-axis magnetic field gradient begins with a first-polarity (e.g. positive) pulse signal 53, from a time $t_c$ to a time $t_g$, having an amplitude-time integral area $A_{X1}$, and having a first-moment appearing to act at pulse center time $t_e$, at a time interval $T_{X1}$ from echo time $t_E$. Thereafter, the dephasing X-axis gradient pulse 55 occurs, from time $t_g$ to time $t_n$; for ease of nulling the areas and first moments in the X-axis magnetic field gradient, gradient pulse 55 is split into first and second portions 55a and 55b, with a separation time $t_k$. For purposes of convenience, the amplitude of all three X-axis gradient pulses 51, 53 and 55 may be made equal, and only the polarity and time duration varied (although such a single amplitude condition need not obtain, as indicated by the different amplitudes of the $G_X$ pulses 50, 53 and 55 illustrated). The initial dephasing X-axis pulse portion 55a begins at time $t_g$ and ends at time $t_k$, has an area $A_{X2}$ and a first moment $M_{X2}$ proportional to the time interval $T_{X2}$, from time $t_i$ to echo time $t_E$; the latter dephasing pulse portion 55b occurs between $t_k$ and time $t_n$, with an area $A_{X3}$ and a first moment $M_{X3}$ proportional to that area and the moment time interval $T_{X3}$ from latter pulse portion center time $t_m$ to echo time $t_E$. The initial gradient readout portion 51a, from time $t_n$ to echo time $t_E$, has an area $A_{X4}$, which appears to act at time $t_p$ and generates a moment $M_{X4}$ proportional to that area and time interval $T_{X4}$, from time $t_p$ to time $t_E$. The X-axis magnetic field gradient $G_X$ thus has a substantially zero value in portion 57, prior to first lobe 53, and in latter portion 59, after time $t_q$, when the latter portion 51b of the readout gradient returns substantially to zero amplitude. In accordance with principles of the invention, the summation of the X-axis gradient areas is nulled, so that $$A_{X1}+A_{X2}+A_{X3}+A_{X4}=0 \tag{4}$$

and the summation of the first X-gradient moment is also nulled, so that $$M_{X1}+M_{X2}+M_{X3}+M_{X4}=0 \tag{5}$$

where $M_{X1}=A_{X1}\cdot T_{X1}$, $M_{X2}=A_{X2}\cdot T_{X2}$, $M_{X3}=A_{X3}\cdot T_{X3}$ amd $M_{X4}=A_{X4}\cdot T_{X4}$. As with phase-encoding, higher orders of motion can be compensated for with more complex waveshapes in the X-axis gradient signal.

In accordance with another principle of the present invention, a first phase-encoding direction rewind pulse 61 is provided after each readout; the pulse 61 has a duration from time $t_r$ to time $t_s$, and an amplitude chosen such that the total amplitude-time integral is a quantity $\Delta A_Y$ which is equal to the inverse of the sum of the Y-axis gradient flow-compensated phase-encoding lobe 47 (area $A_{Y2}$) and lobe 45 (area $A_{Y1}$). Thus, the sum of the Y-axis magnetic field gradient $G_Y$ areas is nulled, for each repetition of the imaging sequence, so that $$A_{Y2}+A_{Y1}+\Delta A_Y=0. \tag{6}$$

If desired, the first repetition of the entire sequence dan be preceded by a first phase-encoding-axis rewind pulse 61', of amplitude and time duration established as above.

It will be seen that, while phase-encodig lobes 40 and 42 and lobes 45 and 47 may occur in essentially the same time intervals, for simultaneous phase-encoding and flow-compensation in both directions, the third axis (here, the X-axis magnetic field gradient $G_X$) need not have the pulses 53 and 55, compensating the area and first moment of the readout pulse initial portion 51a, coincident with any of the pulses of the other two gradient magnetic fields. Thus, pulse 53 starting time $t_c$ need only be after the RF pulse 33 completion time $t_9$, while pulse 55b need end not later than the readout pulse 51 start time $t_n$.

It will be understood that phase-encoded flow artifacts are reduced by shaping the gradient pulses to focus the echoes from both stationary and flowing material at the echo time $T_E$ when the NMR response signal is acquired, and that constant flow velocity artifacts are eliminated by nulling the gradient first moments with respect to the echo time, so that $$\int_0^{t_E} (t - t_E)G(t)dt = 0. \tag{7}$$

Nulling higher order terms appears to give a negligible improvement in image quality, and, while acceleration compensation can be accomplished by shaping the gradient pulses to null second-moment terms, however, we have found that second-moment nulling procedures increase the acquisition time.

Figure 3B:
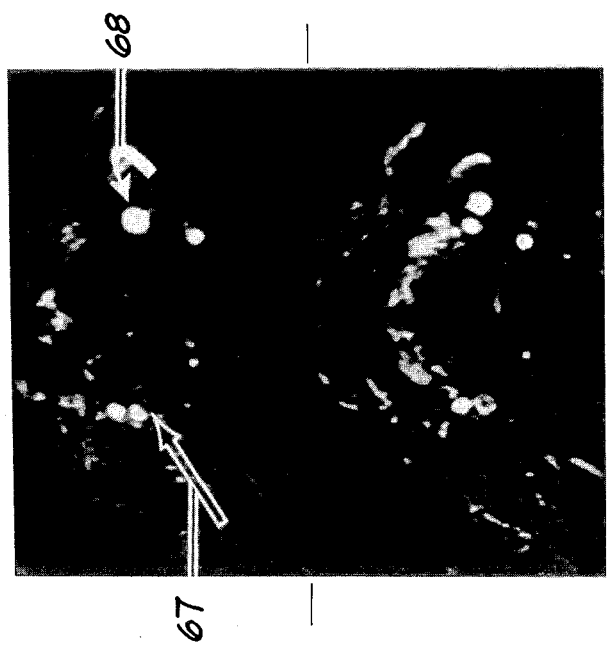
FIG. 3B is a pair of axial NMR slice images, in planes dictated by the angiographic flow data of FIG. 3A, and useful for comparison purposes.
Figure 3A:
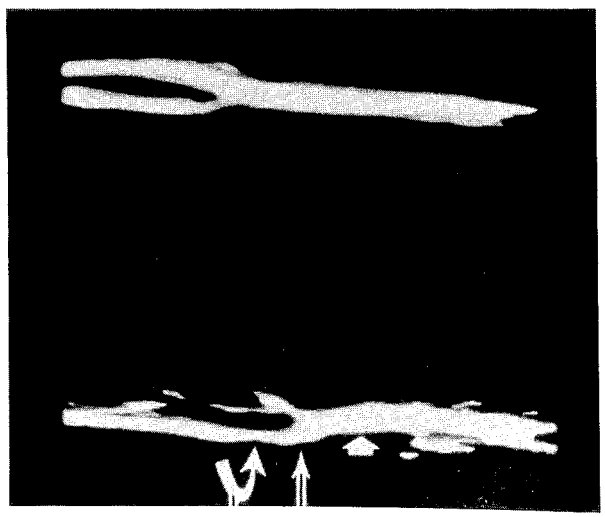
FIG. 3A is a photograph of an angiographic display of the carotid artery bifurcations of a volunteer subject, illustrating acquisition of atherosclerotic plaque information.

Referring now to FIG. 3A, an angiograph of the neck area of a human volunteer subject is shown. The image data set, which ideally contains information from only arterial blood, was formed by the subtraction of voxel information from first and second image data sets, each containing an image reconstructed separately from one of the first data set (with the presaturation pulses 27 and 29) and the second data set (devoid of pulses 27 and 29 prior to imaging sequence 25). The angiograph of the 46-year old male volunteer shows a pronounced crescent-shaped area 64 and a considerably smaller crescent-shaped area 65 the posterior aspect of the left internal carotid artery. Both show reduced vessel cross-section and appear to indicate the presence of plaque. The angiographic findings were verified with a pair of axial slice images, shown in FIG. 3B. The first slice, shown in the upper half of the image, was taken in a plane cutting through the larger crescent-shaped region 64; a crescent-shaped region 67 of narrowing is shown in the bifurcated left carotid artery, while the single right carotid artery lumen 68 is substantially circular (being encountered slightly below the bifurcation thereof). The bottom half of FIG. 3B is another axial slice image taken in a plane slightly above the image in the plane of the top portion of this Figure, and clearly shows both bifurcated carotid arteries, with substantially circular lumens of all four branches. Thus, stenosis of the internal carotid artery is seen to appear as a vertical groove in region 64 and 67, on the distal posterior surface of the right carotid artery. The source of flow signal (shown as a decreased intensity) at the posterior luminal surface is expected if plaque is present; and commencement of plaque formation and growth in the posterior lateral aspect of the carotid sinus is frequently encountered and well known, and usually attributed to the hemodynamics which reduce the chemical transport in this region of low shear flow. The stenosis regions seen in FIG. 3A, imaged by utilized of the modulated presaturation method of the present invention, may be missed in angiographic imaging, unless the view direction catches the stenosis in profile. Thus, use of the method of the present invention, especially with construction of a gradient-shaded three-dimensional image formed by surface following techniques, provides a sensitive method for detecting surface roughness, among other diagnostic and scientific uses.

While one presently preferred embodiment of our novel three-dimensional magnetic resonance flow-contrast angiographic method has been described in detail herein, many variations and modifications will now become apparent to those skilled in the art. It is our intent, therefore, to be limited only by the scope of the appending claims, and not by way of detail or instrumentalities described herein with respect to the one described presently preferred embodiment.

What we claim is:

1. A method for providing a three-dimensional nuclear magnetic resonance (NMR) flow-contrast anigograph of fluid flowing substantially only in a predetermined direction through a selected volume portion of a sample, comprising the steps of:
    (a) acquiring a first set of volume image data from NMR responses generated from the selected volume by a three-dimensional volume imaging sequence preceded by a saturation portion saturating nuclear spins in a predetermined volume adjacent to, and in the direction from which the desired flow will enter, the selected volume;
    (b) acquiring a second set of volume image data from other NMR responses generated from the selected volume by the same three-dimensional volume imaging sequence, but devoid of any preceding saturation portion, and comprising the steps of (1) immersing the sample in a main static magnetic field, (2) nutating the nuclear spins in the selected volume by an angle which is less than 90°, (3) applying a phase-encoding subsequence after each nutating step, and (4) acquiring a set of NMR response data responsive to each phase-encodation subsequence; and
    (c) subtracting one of the first and second image data sets from the other to generate a difference data set from which an image with substantial suppression of stationary material, surrounding the flowing fluid, is displayable.

2. The method of claim 1, wherein the selected volume portion is defined by Cartesian coordinates, and further including the steps of: assigning two axes for phase-encodation; and assigning a remaining axis for frequency-encodation.

3. The method of claim 2, further comprising the step of providing flow-compensation along at least one of the phase-encodation axes.

4. The method of claim 3, further comprising the step of providing flow-compensation along both of the phase-encodation axes.

5. The method claim 1, wherein step (a) comprises all of the steps of step (b) and the additional preceding step of saturating the spins of all nuclei of the selected species within the predetermined adjacent volume.

6. The method of claim 5, wherein the saturating step includes the steps of: nutating the magnetization of the selected species nuclei by an angle $\alpha'$ of between about 60° and about 120°, in a direction selected to remove longitudinal magnetization in the predetermined volume; and subjecting the volume in which nuclear spins are to be saturated to a magnetic field gradient of characteristics selected to substantially limit local magnetization perturbation to the predetermined volume.

7. The method of claim 6, wherein the nutation angle $\alpha'$ is about 90°.

8. The method of claim 6, wherein the saturating step further includes the step of substantially dephasing the transverse magnetization resulting from the nutating step.

9. The method of claim 6, wherein the nutating step includes the step of irradiating the sample with a pulsed radio-frequency magnetic field signal which is complexly modulated by at least one envelope-shaping factor determining the degree of offset of the center of the predetermined volume from the center of the selected volume.

10. The method of claim 1, wherein each three-dimensional volume imaging sequence is a gradient-refocussed 3D Fourier transform (3DFT) sequence commencing with the step of nutating nuclear spins in the sample volume by a flip angle $\alpha$ of between about 20° to about 40°.

11. The method of claim 10, wherein the flip angle $\alpha$ is about 30°.

12. The method of claim 11, wherein each 3DFT sequence is repeated N times, where N is the product of a plurality M of stripes in each of a plurality L of planes making up the selected volume.

13. The method of claim 10, further comprising the step of setting the amplitude-time integration product areas of all magnetic gradient field signal pulses substantially equal to zero in at least one gradient direction.

14. The method of claim 13, wherein the volume is defined by a set of Cartesian coordinates, and further comprising the step of setting the amplitude-time integration product areas of all magnetic gradient field signal pulses substantially equal to zero in each of a readout gradient direction and one of a pair of phase-encoding gradient direction.

15. The method of claim 13, further comprising the step of setting a sum of the first moments of all magnetic gradient field signal pulses with respect to a sequence data acquisition center time $t_E$, in a time interval from the effective time at which nutation by flip angle $\alpha$ occurs and the data acquisition center time for that sequence, to compensate for fluid flow velocity errors in at least one phase-encoding gradient direction.

16. The method of claim 15, wherein the first moment sum is nulled substantially to zero.

17. The method of claim 15, further comprising the step of setting the first moment of all magnetic gradient field signal pulses with respect to the sequence data acquisition center time $t_E$, and in the same time interval, to compensate for fluid flow velocity errors in a second phase-encoding gradient direction.

18. The method of claim 17, wherein the first sum in each phase-encoding gradient direction is separately nulled substantially to zero.

19. The method of claim 17, further comprising the step of setting the first moment of all magnetic gradient field signal pulses with respect to the sequence data acquisition center time $t_E$, and in the same time interval, to compensate for fluid flow velocity errors in a readout gradient direction.

20. The method of claim 19, wherein the first moment sum is nulled substantially to zero.

21. The method of claim 17, further comprising the step of nulling substantially to zero each of at least one higher order moments in each of at least one gradient direction to compensate for associated higher order flow motion errors.

22. The method of claim 14, further comprising the step of providing after each readout a rewind pulse in the magnetic gradient field in the remaining phase-encoding direction.

23. The method of claim 22, wherein further comprising the step of setting the amplitude-time integration product areas of the rewind and all other magnetic gradient field signal pulses in that remaining phase-encoding gradient direction substantially equal to zero.

24. The method of claim 1, further comprising the step of temporally interleaving the acquisition steps (a) and (b) for each similar one of a plurality of portions of the first and second volume image data sets.

25. The method of claim 1, wherein step (a) further comprises the step (a1) of establishing the adjacent volume, to be presaturated, to include first and second volumes located in opposite directions from the selected sample portion.

26. The method of claim 1, wherein step (a) further comprises the steps of: (a1) first acquiring a first preliminary data set responsive to the volume imaging sequence being preceded by a saturation portion saturating spins in a first volume adjacent to the selected volume and offset in a first direction; (a2) then acquiring a second preliminary data set responsive to the volume imaging sequence being preceded by a saturation portion saturating spins in a second volume adjacent to the selected volume but offset in a second direction substantially opposite to the first direction; and subtracting one of the first and second preliminary data sets from the other to obtain the first set of volume image data.

27. The method of claim 26, wherein step (b) further comprises the steps of: (b1) subtracting the second set of volume image data from the first preliminary data set to form the first volume image data sets; and (b2) subtracting the second set of volume image data from the second preliminary data set, to form the second volume image data set.

* * * * *